(12) United States Patent
Noda

(10) Patent No.: US 6,417,038 B1
(45) Date of Patent: *Jul. 9, 2002

(54) METHOD OF FABRICATING SEMICONDUCTOR DEVICE

(75) Inventor: Kenji Noda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/239,678

(22) Filed: Jan. 29, 1999

(30) Foreign Application Priority Data

Jan. 29, 1998 (JP) .......................................... 10-016917

(51) Int. Cl.[7] .......................................... H01L 21/8238
(52) U.S. Cl. ........................ 438/224; 438/300; 438/416
(58) Field of Search ................................. 438/224, 222, 438/223, 199, 229, 230, 231, 232, 481, 291, 298, 300, 478, 219, 220, 226–228, 406, 416; 257/371

(56) References Cited

U.S. PATENT DOCUMENTS

| 5,324,685 A | * | 6/1994 | Hirtz et al. | 438/224 |
| 5,350,939 A | * | 9/1994 | Honda et al. | 257/371 |
| 5,589,410 A | * | 12/1996 | Sato et al. | 438/291 |
| 5,990,535 A | * | 11/1999 | Palara | 257/371 |
| 6,043,114 A | * | 3/2000 | Kawagoe et al. | 438/224 |

FOREIGN PATENT DOCUMENTS

| EP | 320217 A2 | * | 6/1989 | 438/227 |
| JP | 59-222957 | | 12/1984 | |
| JP | 60-211867 | | 10/1985 | |
| JP | 61-32462 | | 2/1986 | |
| JP | 63169059 | | 7/1988 | |
| JP | 63-169065 | | 7/1988 | |
| JP | 63-177470 | | 7/1988 | |
| JP | 64-21948 | * | 1/1989 | 257/371 |
| JP | 3-262155 | * | 11/1991 | 257/371 |

* cited by examiner

Primary Examiner—Douglas A. Wille
Assistant Examiner—Theresa T. Doan
(74) Attorney, Agent, or Firm—Young & Thompson

(57) ABSTRACT

There is provided a method of fabricating a semiconductor device, including the steps of (a) forming both a p-well region and an n-well region at a surface of a semiconductor substrate, and (b) forming an n-type epitaxial layer on both the p- and n-well regions so that the n-type epitaxial layer contains impurities therein at a concentration lower than a concentration of impurities contained in the n-well region. For instance, the n-type epitaxial layer is formed by chemical vapor deposition in which a process gas including phosphorus or arsenic compounds therein is used. In accordance with the method, it is possible to optimize threshold voltages of both n-type and p-type transistors in a low-impurity channel transistor at a smaller number of steps. This ensures reduction in fabrication cost and enhancement in a fabrication yield.

4 Claims, 7 Drawing Sheets

METHOD OF FABRICATING SEMICONDUCTOR DEVICE

BACKGROUND OF THE INVENTION

1. Field of the Invention

The invention relates to a method of fabricating a semiconductor device, and more particularly to such a method capable of fabricating CMOS semiconductor device in a smaller size and in a smaller number of steps.

2. Description of the Related Art

As a semiconductor device has been fabricated in higher integration, a concentration of impurities having an electrical conductivity opposite to an electrical conductivity of a channel region in a semiconductor substrate has been Ski increased in order to suppress short channel effect in MOS transistor.

In a surface-channel type transistor, as illustrated in FIG. 1, a threshold voltage is controlled by additionally introducing impurities having an electrical conductivity opposite to an electrical conductivity of a channel region, into a surface of a semiconductor substrate in the vicinity of the channel region.

However, in a transistor including a gate having a gate length of 0.5μm or smaller, impurities to be implanted into a substrate have to have a higher concentration in order to suppress short channel effect, resulting in that a threshold voltage becomes too high. Hence, as illustrated in FIG. 2, it would be necessary to reduce a concentration of impurities in a region in the vicinity of a surface of a semiconductor substrate.

However, ion-implantation and thermal diffusion have limitation in reducing a concentration of impurities in a region in the vicinity of a surface of a semiconductor substrate. Namely, it is quite difficult for conventional methods to reduce a threshold voltage down to 1V or smaller in a transistor including a gate having a gate length of about 0.1μm. If a threshold voltage could not be reduced down to 1V or smaller, a transistor could not make high-speed operation at a low voltage and at low power consumption.

In order to solve the above-mentioned problem, there has been suggested MOS transistor formed at a surface of a substrate with a layer containing impurities at a low concentration. Such MOS transistor is called a low-impurity channel transistor. For instance, Japanese Unexamined Patent Publications Nos. 59-222957, 60-211867, 61-32462, 63-169065, and 63-177470.

Japanese Unexamined Patent Publication No. 59-222957 has suggested a semiconductor device including a semiconductor substrate having a first electrical conductivity, an epitaxial layer formed on the substrate and having a second electrical conductivity, a first buried layer formed at an interface between the substrate and the epitaxial layer, and having the first electrical conductivity, a second buried layer formed at an interface between the substrate and the epitaxial layer, and having the second electrical conductivity, and a well layer extending from the epitaxial layer to the first buried layer. A first MOSFET having the second electrical conductivity is formed on the well layer, and a second MOSFET having the first electrical conductivity is formed on the epitaxial layer above the second buried layer.

Japanese Unexamined Patent Publication No. 60-211867 has suggested a semiconductor device including a p-type silicon substrate, an epitaxial layer formed on the p-type silicon substrate, n- and p-well regions formed in the epitaxial layer in contact with the p-type silicon substrate, NPN bipolar transistor formed on the n-type well region, and an n-channel MOS transistor formed on the p-type well region. The n- and p-well regions have a highly doped region at a bottom. A concentration of impurities decreases from the highly doped region towards a surface of the silicon substrate.

Japanese Unexamined Patent Publication No. 61-32462 has suggested a semiconductor device including a silicon substrate, first MOS transistor formed at a first electrical conductivity region of the silicon substrate and having a second electrical conductivity, a first low impurity layer formed at a surface of the silicon substrate and containing impurities at a concentration smaller than that of the first electrical conductivity region by an order or greater, a channel region of the first MOS transistor being formed on the first low impurity layer, second MOS transistor formed at a second electrical conductivity region of the silicon substrate and having a first electrical conductivity, and a second low impurity layer formed at a surface of the silicon substrate and containing impurities at a concentration smaller than that of the second electrical conductivity region by an order or greater, a channel region of the second MOS transistor being formed on the second low impurity layer.

Japanese Unexamined Patent Publication No. 63-169065 has suggested a insulating gate type field effect transistor including a semiconductor substrate, and an epitaxial layer formed at a surface of the semiconductor substrate. The epitaxial layer contains impurities at a concentration smaller than that of the semiconductor substrate, and has a thickness equal to or smaller than a width of a depletion layer to be formed in a channel region.

Japanese Unexamined Patent Publication No. 63-177470 has suggested a method of fabricating an insulating gate type field effect transistor, including - the step of forming an epitaxial layer at a surface of a semiconductor substrate by molecular beam epitaxy (MBE). The epitaxial layer is designed to contain impurity at a concentration smaller than that of the semiconductor substrate, and have a thickness equal to or smaller than 1000 angstroms. By forming the epitaxial layer, the field effect transistor could have an impurity profile in which a concentration of impurity varies in a step-like fashion in a depth-wise direction, and include a highly resistive active layer in a channel region.

Hereinbelow is explained a structure of a conventional low-impurity channel transistor with reference to FIG. 3, which is a cross-sectional view of an n-type transistor.

With reference to FIG. 3, a low-impurity channel transistor is comprised of a p-type silicon substrate (or a p-type well region) 1, field oxide films 4 formed at a surface of the p-type silicon substrate 1, a p-type silicon layer 51 containing impurity at a concentration smaller than that of the silicon substrate 1 by an order or greater, and acting as a channel region, source and drain regions 52 and 53 formed at a surface of the silicon substrate 51 around the p-type silicon layer 51, and containing n-type impurity at a high concentration, a gate oxide film 6 formed on the p-type silicon layer 51, and a gate electrode 7 formed on the gate oxide film 6.

By designing the p-type silicon layer 51 to contain impurity at a relatively high concentration, it would be possible to prevent a depletion layer from extending from the drain region 53 to the source region 52, resulting in that it is possible to suppress punchthrough.

When the above-mentioned conventional transistor is used for constituting CMOS transistor, NMOS and PMOS transistors in CMOS transistor have to be optimized. A substrate of NMOS transistor is usually designed to contain boron or boron compound such as $BF_2$, and a substrate of PMOS transistor is usually designed to contain phosphorus or arsenic.

FIG. 4A illustrates p-type impurity profile in NMOS transistor in a direction perpendicular to a surface of a substrate, and FIG. 4B illustrates n-type impurity profile in PMOS transistor in a direction perpendicular to a surface of a substrate. Boron contained in a substrate of NMOS transistor as a p-type impurity has a greater diffusion rate than that of phosphorus or arsenic contained in a substrate of PMOS transistor as an n-type impurity. Hence, after boron has been diffused and re-profiled by annealing to be carried out subsequently to formation of a low impurity layer at a surface of a substrate, a substrate of NMOS transistor contains boron at a surface thereof at a concentration greater than that of phosphorus or arsenic contained in a substrate of PMOS transistor.

For the above-mentioned reason, when CMOS transistor is to be fabricated of such a low-impurity channel transistor or a molecular layer doping transistor as mentioned above, there is caused a problem that if a silicon layer containing no impurities therein is concurrently formed at a surface of a substrate of each of NMOS and PMOS transistors, NMOS transistor would have a higher threshold voltage than that of PMOS transistor, resulting in that threshold voltages of NMOS and PMOS transistors cannot be concurrently optimized.

In order to avoid such a problem as mentioned above, low impurity layers having first and second electrical conductivity may be formed separately on surfaces of substrates of NMOS and PMOS transistors, respectively. For forming such low impurity layers, there are two methods. In a first method, it is necessary to form a p-type low impurity layer separately from an n-type low impurity layer. In a second method, it is necessary to first form non-doped silicon layers in NMOS and PMOS transistors, and then, introduce impurities having first and second electrical conductivity into each of the non-doped silicon layers.

Hereinbelow is explained the above-mentioned first method where a low impurity layer is to be formed twice, with reference to FIGS. 5A to 5H.

First, as illustrated in FIG. 5A, a p-type well region 2 and an n-type well region 3 are formed at a surface of a p- or n-type silicon substrate 1 by means of ion-implantation and thermal diffusion, for instance. Then, field oxide films 4 are formed at a surface of the silicon substrate 1 by LOCOS. The field oxide films 4 are formed at an interface between the p- and n-type well regions 2 and 3, and define therein a region in which MOS transistor is to be fabricated.

As an alternative, the field oxide films 4 may be first formed, and then the p- and n-type well regions 2 and 3 may be formed by ion-implantation and thermal diffusion.

Then, as illustrated in FIG. 5B, a silicon dioxide ($SiO_2$) film 71 is formed on the silicon substrate 1 by chemical vapor deposition (CVD).

Then, as illustrated in FIG. 5C, the silicon dioxide film 71 is covered above the n-type well region 3 with a photoresist film 72A. Thereafter, the silicon dioxide film 71 formed on the p-type well region 2 is removed, for instance, by means of hydrofluoric acid.

Then, as illustrated in FIG. 5D, a non-doped silicon layer 73A is grown in crystal structure on an exposed surface of the p-type well region 2 by ultra-high vacuum chemical vapor deposition (UHV-CVD). The non-doped silicon layer 73A has a thickness in the range of 10 nm to 100 nm.

Thereafter, the photoresist layer 72A is removed.

Then, as illustrated in FIG. 5E, a silicon dioxide ($SiO_2$) film 74 is formed again on both the non-doped silicon layer 73A and the previously formed silicon dioxide film 71 by CVD.

Then, as illustrated in FIG. 5F, the silicon dioxide film 74 is covered above the p-type well region 2 with a photoresist film 72B. Thereafter, the silicon dioxide films 71 and 74 formed on the n-type well region 3 are removed, for instance, by means of hydrofluoric acid.

Then, as illustrated in FIG. 5G, a non-doped silicon layer 73B is grown in crystal structure only on an exposed surface of the n-type well region 3 by UHV-CVD. The non-doped silicon layer 73B has a thickness in the range of 10nm to 100 nm. In order to equalize threshold voltages of PMOS and NMOS transistors to each other, the non-doped silicon layer 73B is designed to have a smaller thickness than that of the non-doped silicon layer 73A.

Then, as illustrated in FIG. 5H, after removal of the silicon dioxide film 74, a gate oxide film 6 is formed on each of the non-doped silicon layers 73A and 74A. Thereafter, in accordance with a conventional process for fabricating MOSFET, a gate electrode 7A composed of n-type polysilicon is formed on the gate oxide film 6, a gate electrode 7B composed of p-type polysilicon is formed on the gate oxide film 6, n-type source and drain regions 8 are formed in the non-doped silicon layer 73A around the gate oxide film 6, and p-type source and drain regions 9 are formed in the non-doped silicon layer 73B around the gate oxide film 6.

As explained so far, by twice carrying out the step of forming a silicon film in crystal structure on a channel region of each of NMOS and PMOS transistors, it is possible to independently optimize a thickness of the silicon films of NMOS and PMOS transistors.

Hereinbelow is explained the above-mentioned second method, with reference to FIGS. 6A to 6D, where non-doped layers are first formed, and then, impurities are implanted into the non-doped layers.

First, as illustrated in FIG. 6A, a p-type well region 2 and an n-type well region 3 are formed at a surface of a p- or n-type silicon substrate 1 by means of ion-implantation and thermal diffusion, for instance. Then, field oxide films 4 are formed at a surface of the silicon substrate 1 by LOCOS at an interface between the p- and n-type well regions 2 and 3. The field oxide films 4 define therein a region in which MOS transistor is to be fabricated.

As an alternative, the field oxide films 4 may be first formed, and then the p- and n-type well regions 2 and 3 may be formed by ion-implantation and thermal diffusion.

Then, as illustrated in FIG. 6B, a non-doped silicon layer 73C is grown in crystal structure only on exposed surfaces of the p- and n-type well regions 2 and 3 by UHV-CVD. The non-doped silicon layer 73C has a thickness in the range of 10 nm to 100 nm.

Then, a silicon dioxide ($SiO_2$) film 74 is formed directly on the non-doped silicon layer 73C.

Then, as illustrated in FIG. 6C, the silicon dioxide film 74 is covered above the p-type well region 2 with a photoresist film 72C. Thereafter, arsenic ions (As+) are implanted at 50 KeV or smaller into the non-doped silicon layer 73C above the n-type well region 3. As a result, the non-doped silicon layer 73C is turned into an n-type impurity layer.

Then, the photoresist film 72C is removed.

Then, as illustrated in FIG. 6D, after removal of the silicon dioxide film 74, a gate oxide film 6 is formed on the n-type impurity silicon layer 73C. Thereafter, in accordance with a conventional process for fabricating MOSFET, a gate electrode 7A composed of n-type polysilicon is formed on the gate oxide film 6, a gate electrode 7B composed of p-type polysilicon is formed on the gate oxide film 6, n-type source and drain regions 8 are formed in the silicon layer 73C around the gate oxide film 6, and p-type source and drain regions 9 are formed in the silicon layer 73C around the gate oxide film 6.

As explained so far, the second method makes it possible to equalize threshold voltages of NMOS and PMOS transistors to each other by ion-implanting n-type impurity into a channel region of PMOS transistor to thereby raise a threshold voltage of PMOS transistor.

However, the above-mentioned first and second methods are accompanied with a problem that they have a greater number of steps than a number of steps for fabricating CMOS transistor with the result of an increase in fabrication cost and reduction in a fabrication yield.

SUMMARY OF THE INVENTION

In view of the above-mentioned problem, it is an object of the present invention to provide a method of fabricating a semiconductor device at a smaller number of steps with a higher fabrication yield.

There is provided a method of fabricating a semiconductor device, including the steps of (a) forming both a p-well region and an n-well region at a surface of a semiconductor substrate, and (b) forming an n-type epitaxial layer on both the p- and n-well regions so that the n-type epitaxial layer contains impurities therein at a concentration lower than a concentration of impurities contained in the n-well region.

The n-type epitaxial layer may be formed by chemical vapor deposition in which a process gas including phosphorus or arsenic compounds therein is used.

There is further provided a method of fabricating a semiconductor device, including the steps of (a) forming both a p-well region and an n-well region at a surface of a semiconductor substrate, (b) forming a non-doped epitaxial layer on both the p- and n-well regions, and (c) ion-implanting n-type impurities to the non-doped epitaxial layer so that the epitaxial layer contains n-type impurities therein at a concentration lower than a concentration of impurities contained in the n-well region.

In accordance with the present invention, it is possible to optimize threshold voltages of both NMOS and PMOS transistors in a low-impurity channel transistor at a smaller number of steps. This ensures reduction in fabrication cost and enhancement in a fabrication yield.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

A method of fabricating a semiconductor device, in accordance with the first embodiment, is explained hereinbelow with reference to FIGS. 7A to 7C.

Figure 1:
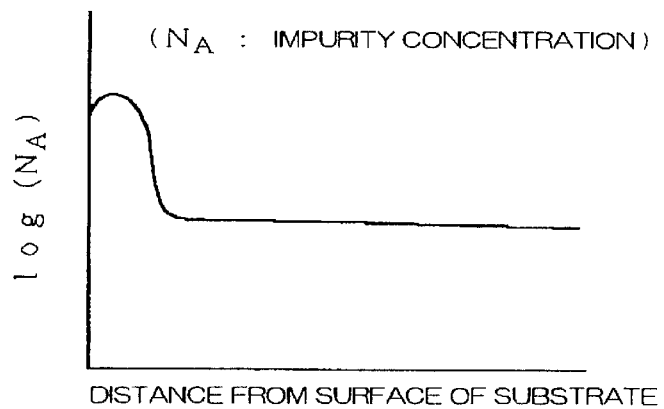
FIG. 1 illustrates an example of impurity profile of a substrate of a surface channel type transistor.
Figure 2:
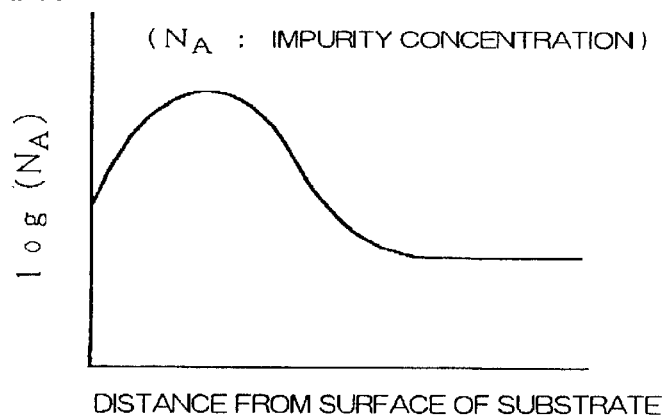
FIG. 2 illustrates another example of impurity profile of a substrate of a surface channel type transistor.
Figure 3:
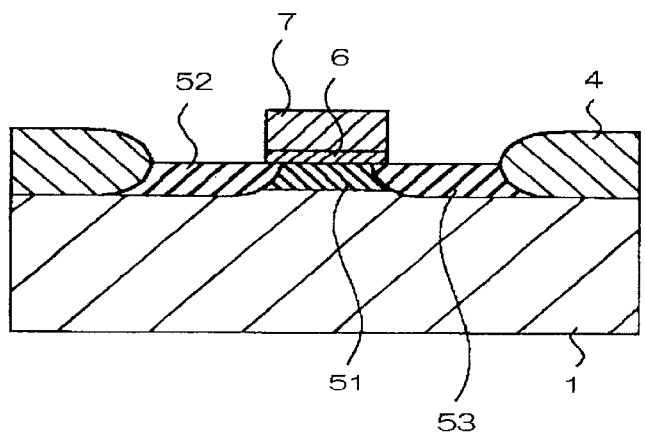
FIG. 3 is a cross-sectional view of a conventional low impurity channel transistor.
Figure 4B:
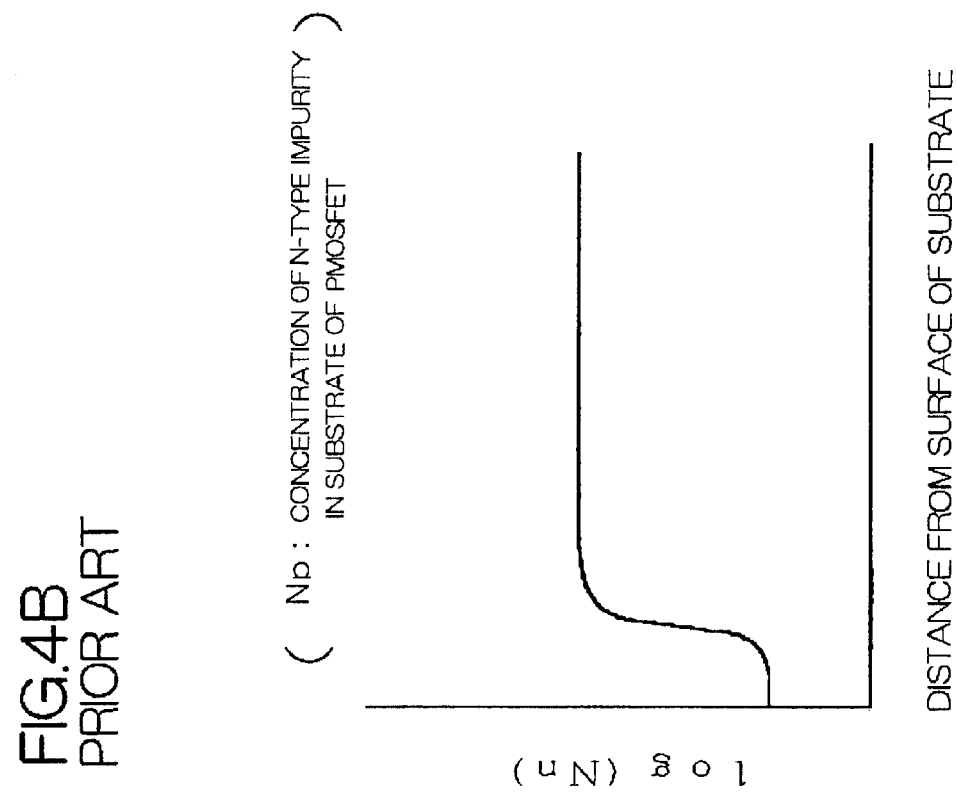
FIG. 4B illustrates n-type impurity profile in PMOS transistor in a direction perpendicular to a surface of a substrate.
Figure 4A:
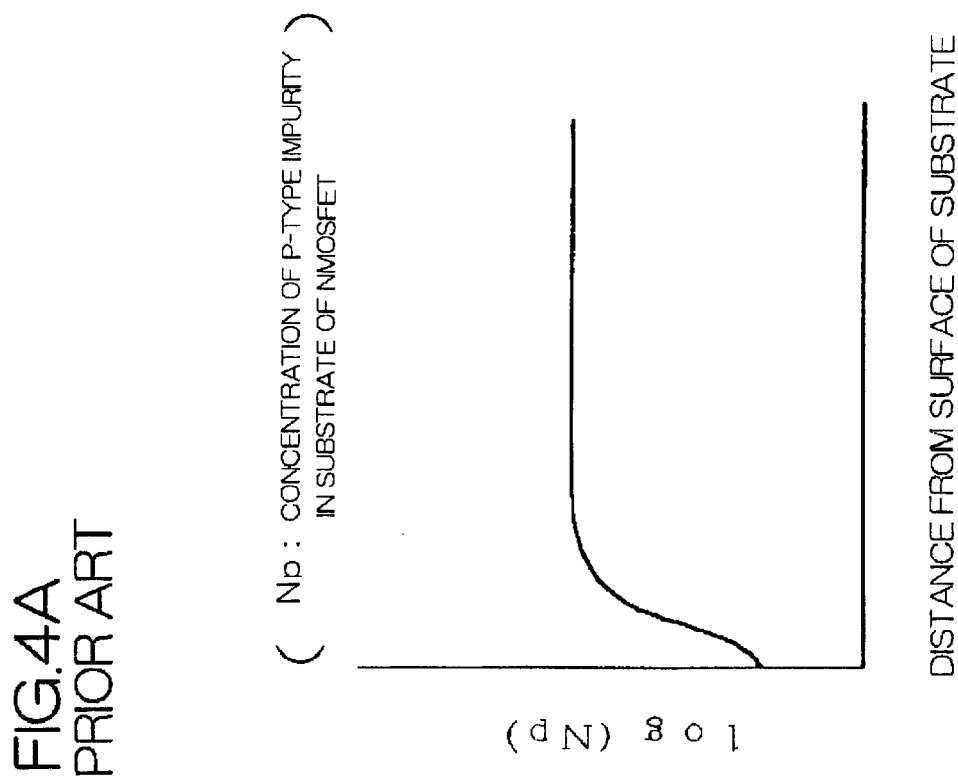
FIG. 4A illustrates p-type impurity profile in NMOS transistor in a direction perpendicular to a surface of a substrate.
Figure 5A:
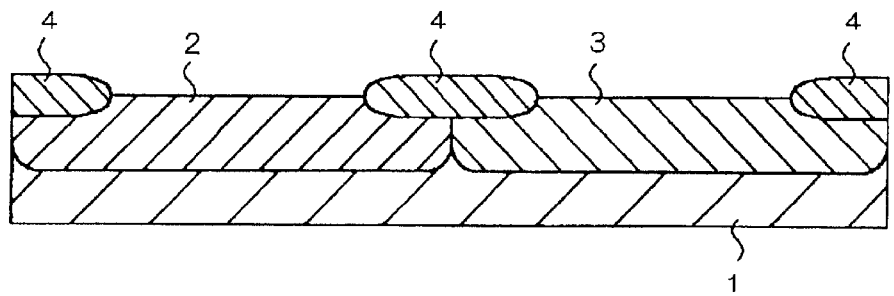
FIGS. 5A to 5H are cross-sectional views of a semiconductor device, illustrating respective steps of a conventional method of fabricating the same.
Figure 5B:
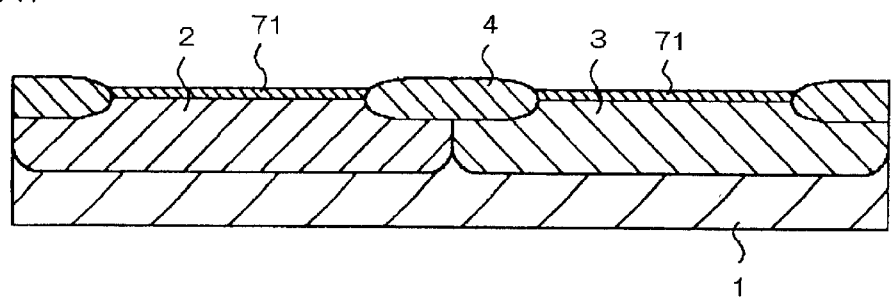
Figure 5C:
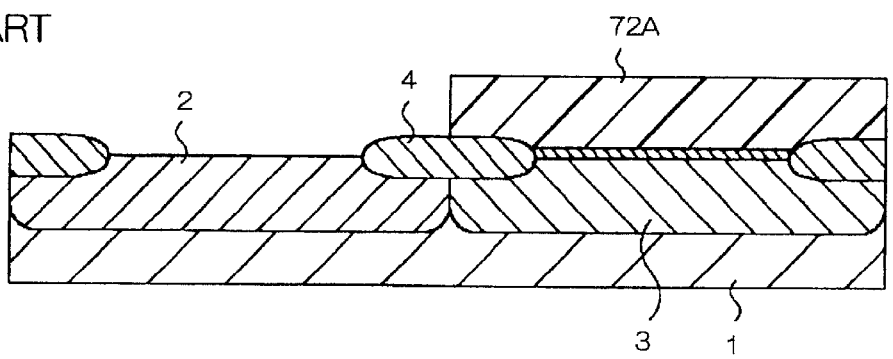
Figure 5D:
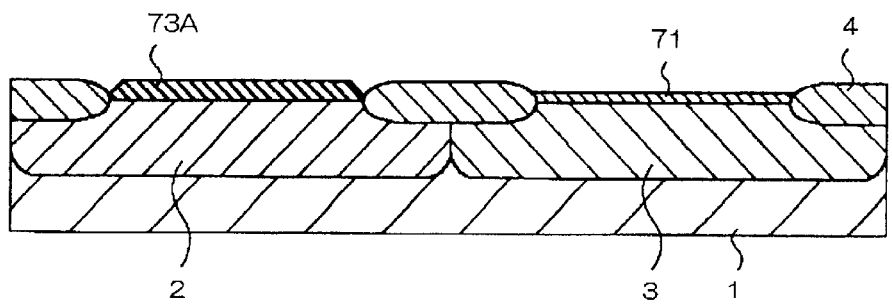
Figure 5E:
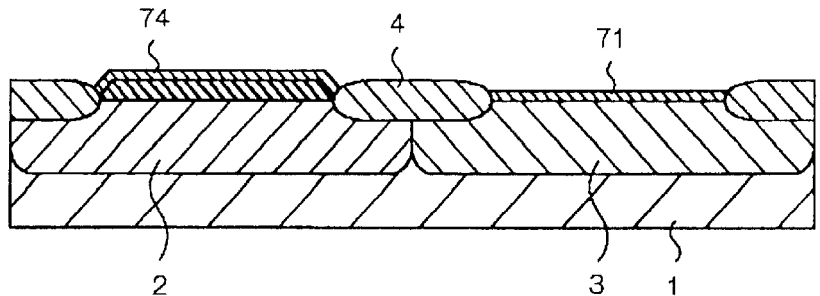
Figure 5F:
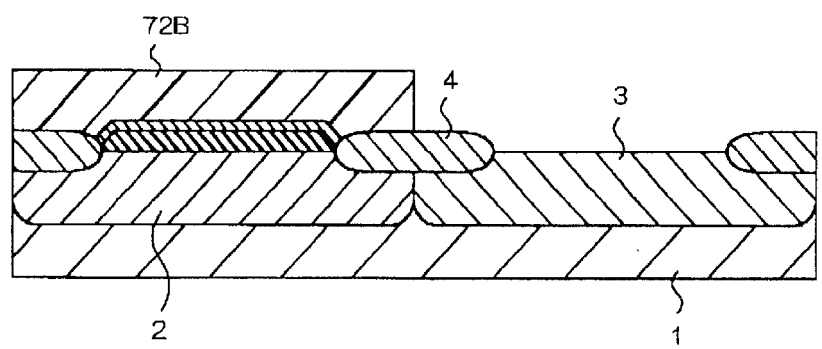
Figure 5G:
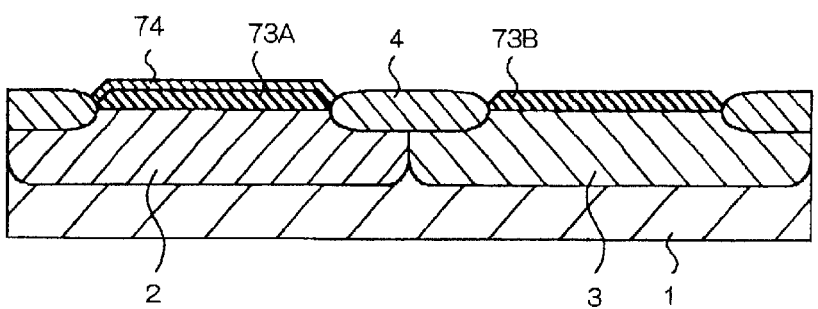
Figure 5H:
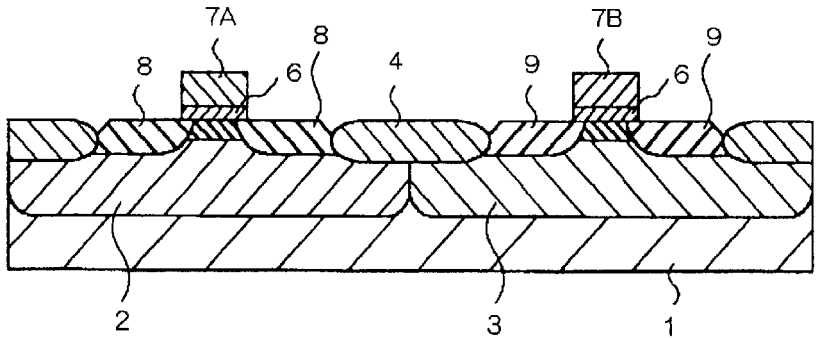
Figure 6A:
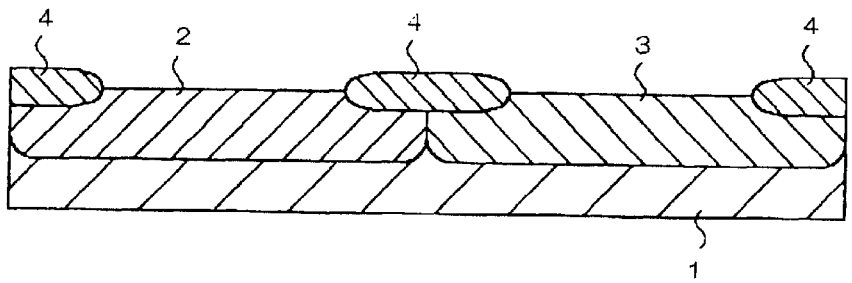
FIGS. 6A to 6D are cross-sectional views of a semiconductor device, illustrating respective steps of another conventional method of fabricating the same.
Figure 6B:
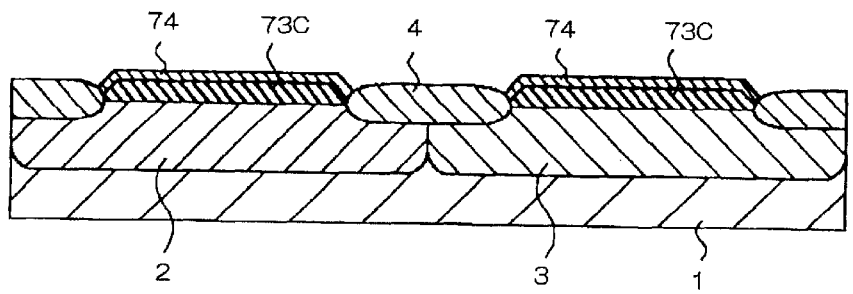
Figure 6C:
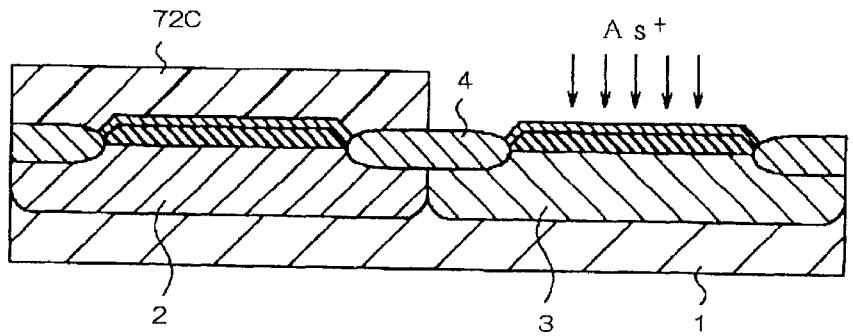
Figure 6D:
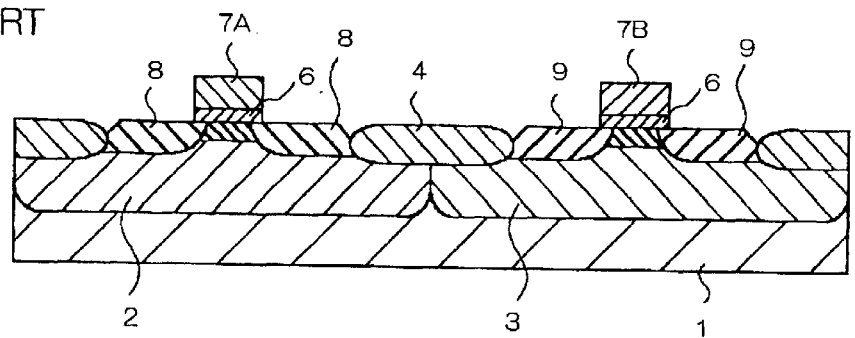
Figure 7A:
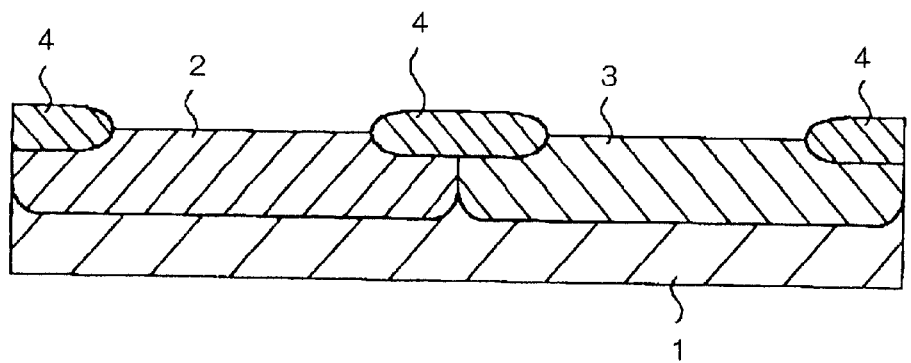
FIGS. 7A to 7C are cross-sectional views of a semiconductor device, illustrating respective steps of a method of fabricating a semiconductor device, in accordance with the first embodiment of the invention.

First, as illustrated in FIG. 7A, a p-type well region 2 and an n-type well region 3 are formed at a surface of a p- or n-type silicon substrate 1 by means of ion-implantation and thermal diffusion, for instance. Then, field oxide films 4 are formed at a surface of the silicon substrate 1 by LOCOS at an interface between the p- and n-type well regions 2 and 3. The field oxide films 4 define therein a region in which MOS transistor is to be fabricated.

As an alternative, the field oxide films 4 may be first formed, and then the p- and n-type well regions 2 and 3 may be formed by ion-implantation and thermal diffusion.

Figure 7B:
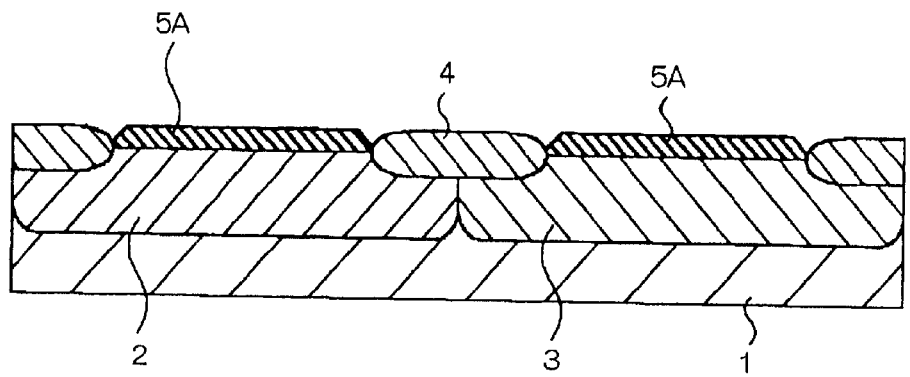

Then, as illustrated in FIG. 7B, an n-type epitaxial layer 5A is grown in crystal structure only on exposed surfaces of the p- and n-type well regions 2 and 3 by UHV-CVD. The n-type epitaxial layer 5A is designed to have a thickness in the range of 10 nm to 100 nm, and contain n-type impurity at a concentration smaller than a concentration of impurity of the n-type well region 3.

In the present embodiment, the n-type epitaxial layer 5A is formed by using a process gas including principally $Si_2H_6$, and slightly $PH_4$ or $AsH_4$. The n-type epitaxial layer 5A contains n-type impurity at a concentration of $1 \times 10^{17}/cm^3$ to $1 \times 10^{19}/cm^3$. In addition, the n-type epitaxial layer 5A is designed to contain n-type impurity at a concentration smaller than a concentration of impurity of the n-type well region 3.

Figure 7C:
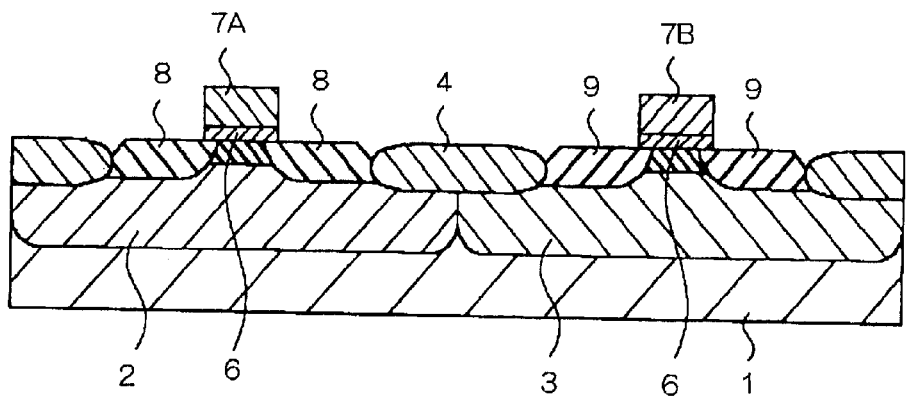

Then, as illustrated in FIG. 7C, a gate oxide film 6 is formed on the n-type epitaxial layer 5A. Thereafter, in accordance with a conventional process for fabricating MOSFET, a gate electrode 7A composed of n-type polysilicon is formed on the gate oxide film 6, a gate electrode 7B composed of p-type polysilicon is formed on the gate oxide film 6, n-type source and drain regions 8 are formed in the n-type epitaxial layer 5A around the gate oxide film 6, and p-type source and drain regions 9 are formed in the n-type epitaxial layer 5A around the gate oxide film 6.

The above-mentioned method in accordance with the first embodiment may be applied to a lightly-doped drain (LDD) MOSFET.

By introducing n-type impurity into a region in the vicinity of a channel region of MOS transistor, a threshold voltage of NMOSFET is decreased, and a threshold voltage of PMOSFET is increased. As having been explained with reference to the prior art, NMOSFET would have a greater threshold voltage than that of PMOSFET in the case that an epitaxial layer is composed of intrinsic semiconductor. Hence, it is possible to make threshold voltages of both NMOSFET and PMOSFET equal to each other by setting a concentration of impurity in the n-type epitaxial layer 5A to be an appropriate one.

In addition, since the n-type epitaxial layer SA formed at a surface of NMOSFET has a small thickness and is entirely depleted, NMOSFET operates in a surface channel type enhancement mode rather than in a buried channel type mode or a depletion mode.

Second Embodiment

A method of fabricating a semiconductor device, in accordance with the second embodiment, is explained hereinbelow with reference to FIGS. 8A to 8D.

Figure 8A:
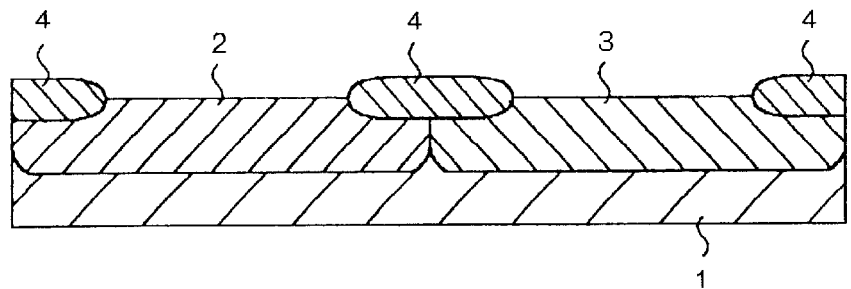
FIGS. 8A to 8D are cross-sectional views of a semiconductor device, illustrating respective steps of a method of fabricating a semiconductor device, in accordance with the second embodiment of the invention.

First, as illustrated in FIG. 8A, a p-type well region 2 and an n-type well region 3 are formed at a surface of a p- or n-type silicon substrate 1 by means of ion-implantation and thermal diffusion, for instance. Then, field oxide films 4 are formed at a surface of the silicon substrate 1 by LOCOS at an interface between the p- and n-type well regions 2 and 3. The field oxide films 4 define therein a region in which MOS transistor is to be fabricated.

As an alternative, the field oxide films 4 may be first formed, and then the p- and n-type well regions 2 and 3 may be formed by ion-implantation and thermal diffusion.

Figure 8B:
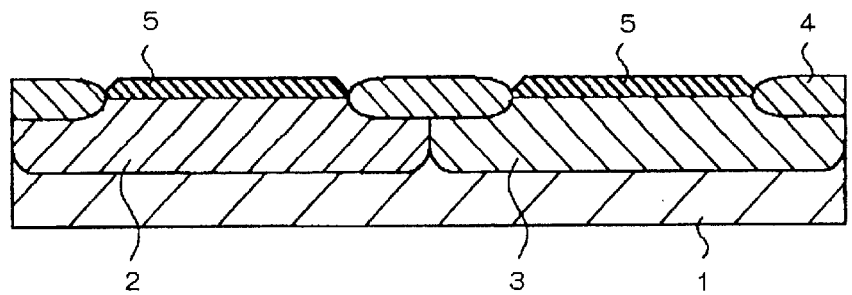

Then, as illustrated in FIG. 8B, a non-doped epitaxial layer 5 is grown in crystal structure only on exposed surfaces of the p- and n-type well regions 2 and 3 by UHV-CVD. The non-doped epitaxial layer 5 is designed to have a thickness in the range of 10 nm to 100 nm.

Figure 8C:
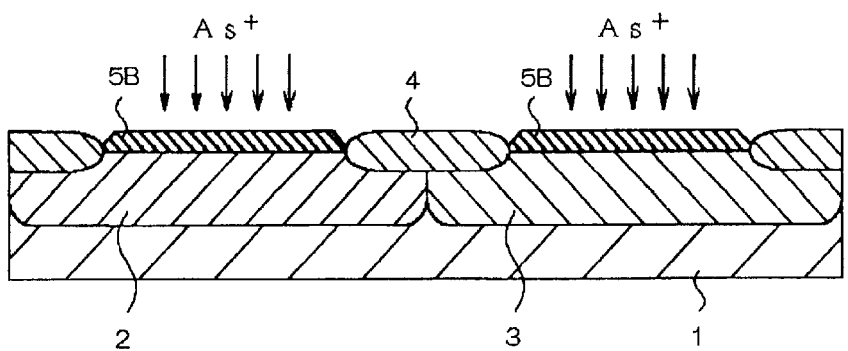

Then, as illustrated in FIG. 8C, the non-doped epitaxial layer 5 is implanted at 50 KeV or smaller with doses of $1 \times 10^{12} - 1 \times 10^{14}$ As$^+$ cm$^{-2}$. As a result, the non-doped epitaxial layer 5 is turned into an n-type epitaxial layer 5B. The non-doped epitaxial layer 5 is implanted with arsenic ions so that the n-type epitaxial layer 5B contains n-type impurity at a concentration smaller than a concentration of impurity in the n-type well region 3.

Figure 8D:
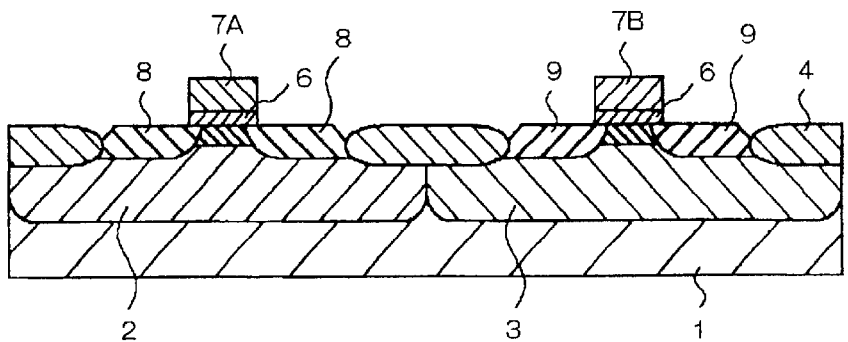

Then, as illustrated in FIG. 8D, a gate oxide film 6 is formed on the ntype epitaxial layer 5B. Thereafter, in accordance with a conventional process for fabricating MOSFET, a gate electrode 7A composed of n-type polysilicon is formed on the gate oxide film 6, a gate electrode 7B composed of p-type polysilicon is formed on the gate oxide film 6, n-type source and drain regions 8 are formed in the n-type epitaxial layer 5A around the gate oxide film 6, and p-type source and drain regions 9 are formed in the n-type epitaxial layer 5A around the gate oxide film 6.

The above-mentioned method in accordance with the second embodiment may be applied to LDD-MOSFET.

Similarly to the first embodiment, by introducing n-type impurity into a region in the vicinity of a channel region of MOS transistor, a threshold voltage of NMOSFET is decreased, and a threshold voltage of PMOSFET is increased. As having been explained with reference to the prior art, NMOSFET would have a greater threshold voltage than that of PMOSFET in the case that an epitaxial layer is composed of intrinsic semiconductor. Hence, it is possible to make threshold voltages of both NMOSFET and PMOSFET equal to each other by setting a concentration of impurity in the n-type epitaxial layer 5B to be an appropriate one.

Specifically, threshold voltages of both NMOSFET and PMOSFET can be made equal to each other by arsenic ion-implantation at a dose of about $1 \times 10^{13}$ As$^+$ cm$^{-3}$, when the p- and n-type well regions 2 and 3 contain impurity at a concentration of $5 \times 10^{17}$ cm$^{-3}$.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-16917 filed on Jan. 29, 1998 including specification, claims, drawings and summary is incorporated herein by reference in its entirety.

What is claimed is:

1. A method of fabricating a semiconductor device, comprising the steps of:
   (a) forming both a p-well region and an n-well region at a surface of a semiconductor substrate; and
   (b) growing an n-type epitaxial layer simultaneously only on both said p- and n- well regions so that the n-type epitaxial layer contains impurities therein at a concentration lower than a concentration of impurities contained in said n-well region.

2. The method as set forth in claim 1, wherein said n-type epitaxial layer is formed by chemical vapor deposition in which a process gas including phosphorus compounds therein is used.

3. The method as set forth in claim 1, wherein said n-type epitaxial layer is formed by chemical vapor deposition in which a process gas including arsenic compounds therein is used.

4. A method of fabricating a semiconductor device, comprising the steps of:
   (a) forming both a p-well region and an n-well region at a surface of a semiconductor substrate; and
   (b) forming a non-doped epitaxial layer only on both said p- and n- well regions;
   (c) ion-implanting n-type impurities to said non-doped epitaxial layer so that said epitaxial layer contains n-type impurities therein at a concentration lower than a concentration of impurities contained in said n-well region; and
   (d) forming an NMOSFET and a PMOSFET in said p- and n-well regions, respectively, wherein a surface portion of the channel of said NMOSFET is n-type, and said NMOSFET operates in a state that said n-type surface portion is entirely depleted.

* * * * *